(12) United States Patent
Sugioka et al.

(10) Patent No.: US 11,587,870 B2
(45) Date of Patent: Feb. 21, 2023

(54) APPARATUS COMPRISING ALUMINUM INTERCONNECTIONS, MEMORY DEVICES COMPRISING INTERCONNECTIONS, AND RELATED METHODS

(71) Applicant: Micron Technology, Inc., Boise, ID (US)

(72) Inventors: Shigeru Sugioka, Hiroshima (JP); Noriaki Fujiki, Hyogo (JP); Keizo Kawakita, Hiroshima (JP); Takahisa Ishino, Hiroshima (JP)

(73) Assignee: Micron Technology, Inc., Boise, ID (US)

( * ) Notice: Subject to any disclaimer, the term of this patent is extended or adjusted under 35 U.S.C. 154(b) by 276 days.

(21) Appl. No.: 16/539,437

(22) Filed: Aug. 13, 2019

(65) Prior Publication Data
US 2021/0050301 A1 Feb. 18, 2021

(51) Int. Cl.
*H01L 23/528* (2006.01)
*H01L 23/532* (2006.01)
*H01L 27/108* (2006.01)

(52) U.S. Cl.
CPC .... *H01L 23/5283* (2013.01); *H01L 23/53223* (2013.01); *H01L 27/10805* (2013.01); *H01L 27/10847* (2013.01)

(58) Field of Classification Search
CPC ......... H01L 21/76885; H01L 23/53223; H01L 27/10847; H01L 27/10805; H01L 23/5283; H01L 23/5222
See application file for complete search history.

(56) References Cited

U.S. PATENT DOCUMENTS

| | | | |
|---|---|---|---|
| 5,968,670 A * | 10/1999 | Brofman | B23K 35/0222 428/592 |
| 6,423,629 B1 * | 7/2002 | Ahn | H01L 21/7682 257/E21.581 |
| 7,741,228 B2 | 6/2010 | Ueki et al. | |
| 7,913,221 B2 | 3/2011 | Miyashita et al. | |

(Continued)

FOREIGN PATENT DOCUMENTS

| CN | 101504948 B | 4/2011 |
|---|---|---|
| JP | 2006-120988 A | 5/2006 |

*Primary Examiner* — Shahed Ahmed
*Assistant Examiner* — Sun Mi Kim King
(74) *Attorney, Agent, or Firm* — TraskBritt

(57) ABSTRACT

An apparatus comprising a multilevel wiring structure comprising aluminum interconnections. The aluminum interconnections comprise a first portion, a second portion, and a third portion, where the second portion is between the first portion and the third portion. The third portion comprises a greater width in a lateral direction than a width in the lateral direction of the second portion. A memory device comprising a memory array comprising memory cells and a control logic component electrically connected to the memory array. At least one of the memory cells comprises a multilevel wiring structure comprising interconnect structures, where the interconnect structures comprise a first portion, a second portion adjacent to the first portion, and a third portion adjacent to the second portion. The third portion comprises a greater width in a lateral direction than a width in the lateral direction of the second portion. Related apparatus, memory devices, and methods are also disclosed.

29 Claims, 8 Drawing Sheets

(56) References Cited

U.S. PATENT DOCUMENTS

| | | |
|---|---|---|
| 8,034,707 B2 | 10/2011 | Ueda |
| 8,084,352 B2 | 12/2011 | Harada et al. |
| 8,084,353 B2 | 12/2011 | Harada et al. |
| 9,368,572 B1 | 6/2016 | Cheng et al. |
| 9,852,987 B2 | 12/2017 | Watanabe |
| 10,128,334 B1 | 11/2018 | Bourjot et al. |
| 10,211,092 B1 | 2/2019 | Cheng et al. |
| 2015/0037980 A1* | 2/2015 | Rha .................... H01L 21/7682 438/700 |
| 2016/0300792 A1* | 10/2016 | Kim .................. H01L 23/53223 |
| 2017/0358673 A1 | 12/2017 | Cheng et al. |
| 2018/0130899 A1 | 5/2018 | Zhang et al. |
| 2018/0190796 A1 | 7/2018 | Ching et al. |
| 2018/0294263 A1 | 10/2018 | Bergendahl et al. |
| 2019/0148526 A1 | 5/2019 | Ching et al. |
| 2020/0098620 A1* | 3/2020 | Lee .................... H01L 23/5283 |
| 2020/0135677 A1* | 4/2020 | Chang ............... H01L 23/49894 |

* cited by examiner

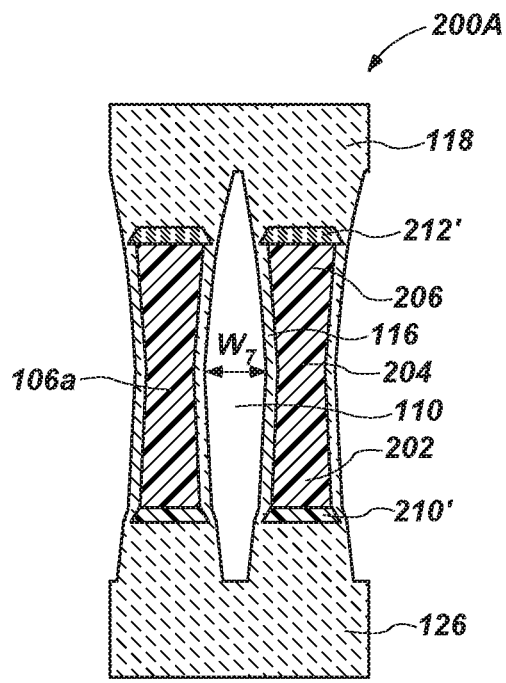 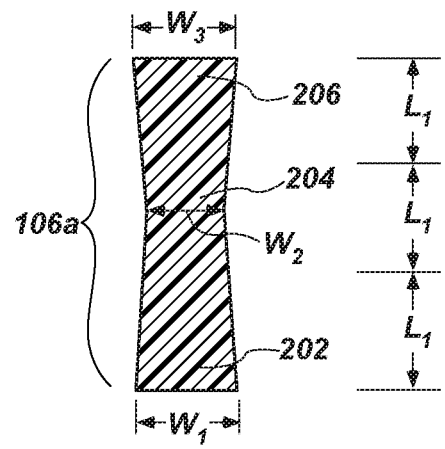
FIG. 2A  FIG. 2B
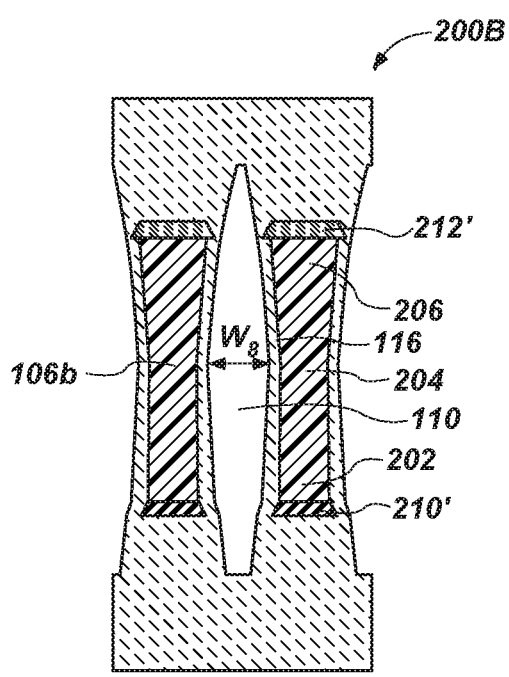 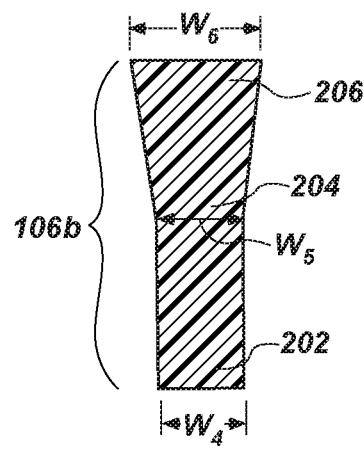
FIG. 3A  FIG. 3B

APPARATUS COMPRISING ALUMINUM INTERCONNECTIONS, MEMORY DEVICES COMPRISING INTERCONNECTIONS, AND RELATED METHODS

TECHNICAL FIELD

Embodiments disclosed herein relate to apparatus (e.g., electronic devices) and to fabrication of the apparatus. More particularly, embodiments of the disclosure relate to apparatus comprising aluminum interconnections, the aluminum interconnections having varying widths along a lateral direction and to related methods, memory devices, and electronic systems.

BACKGROUND

Semiconductor device designers often desire to increase the level of integration or density of features (e.g., components) within a semiconductor device by reducing the dimensions of the individual features and by reducing the separation distance between neighboring features. In addition, semiconductor device designers often desire to design architectures that are not only compact, but offer performance advantages, as well as simplified designs. Reducing the dimensions and spacing of semiconductor device features places ever increasing demands on the methods used to form the semiconductor device features.

A relatively common semiconductor device is a memory device, which may include a memory array having a number of memory cells arranged in a grid pattern. One type of memory cell is a dynamic random access memory (DRAM) device, which is a volatile memory device that may lose a stored state over time unless the DRAM device is periodically refreshed by an external power supply. In the simplest design configuration, a DRAM cell includes one access device (e.g., a transistor) and one storage device (e.g., a capacitor). Modern applications for memory devices may utilize vast numbers of DRAM unit cells, arranged in an array of rows and columns. The DRAM cells are electrically accessible through digit lines and word lines arranged along the rows and columns of the array. High data reliability, high speed of memory access, reduced chip size, and reduced power consumption are desirable performance properties of DRAM devices.

As the dimensions and spacing of the conductive features decrease, multilevel wiring structures have been used in DRAM devices to electrically connect the conductive features to one another. The DRAM device includes the wiring structures at different levels, with the wiring structures formed of electrically conductive materials to provide conductive pathways through the DRAM device. As the dimensions and spacing of the conductive features continue to decrease, parasitic (e.g., stray) capacitance between adjacent conductive features within the DRAM device increases. The increased parasitic capacitance causes higher power demands and delay of the DRAM device. Air gaps have been used to electrically isolate the conductive features, such as copper features.

BRIEF DESCRIPTION OF THE DRAWINGS

FIGS. 2A and 2B are cross-sectional views showing an interconnection structure including aluminum interconnections according to some embodiments of the disclosure;

FIGS. 3A and 3B are cross-sectional views showing an interconnection structure including aluminum interconnections according to other embodiments of the disclosure;

DETAILED DESCRIPTION

Figure 1:
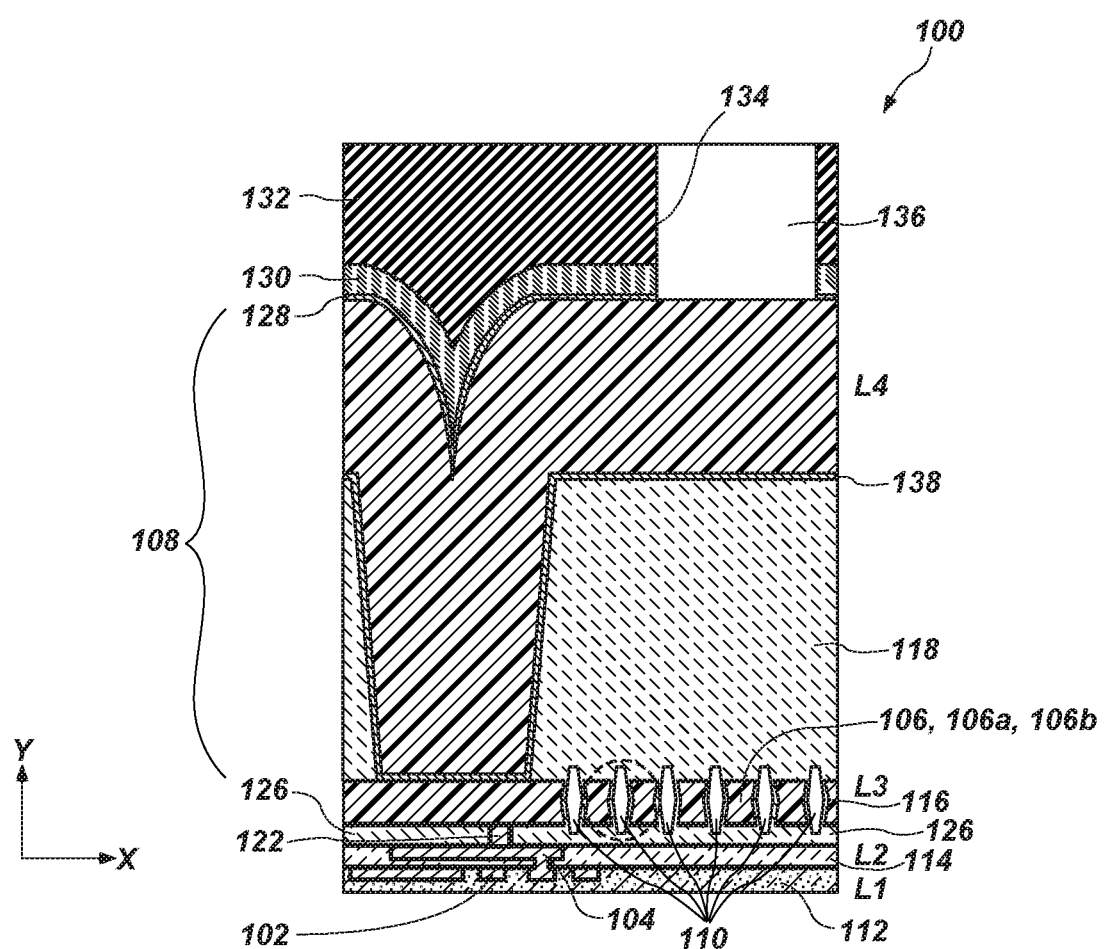
FIG. 1 is a cross-sectional view of an electronic device including aluminum interconnections according to embodiments of the disclosure.

An electronic device (e.g., an apparatus) that includes aluminum interconnections having varying widths is disclosed. The electronic device includes a multilevel wiring structure that includes the aluminum interconnections as one level (e.g., an interconnection level) of the multilevel wiring structure. The aluminum interconnections include a first portion, a second portion, and a third portion, with the third portion exhibiting a greater width in a lateral direction than a width in the lateral direction of the second portion. A cross-sectional shape of the aluminum interconnections includes the third portion exhibiting the greater width in the lateral direction than the width in the lateral direction of the second portion. In some embodiments, the cross-sectional shape of the aluminum interconnections at the first portion exhibits a width in the lateral direction that is greater than or equal to the width in the lateral direction at the second portion. In such embodiments, the cross-sectional shape of the aluminum interconnections exhibits a so-called "hourglass" shape (e.g., a concave bow shape). In other embodiments, the cross-sectional shape of the aluminum interconnections at the second portion exhibits a greater width in the lateral direction than the width in the lateral direction at the first portion. In such embodiments, the cross-sectional shape of the aluminum interconnections may exhibit a taper (e.g., be taper-shaped, substantially Y-shaped). Sidewalls of the aluminum interconnections define air gaps between adjacent aluminum interconnections of the electronic device. By forming the aluminum interconnections having the varying widths, widths of the air gaps between the adjacent aluminum interconnections are increased, which reduces parasitic capacitance between the adjacent aluminum interconnections. By decreasing the parasitic capacitance, the electronic device containing the aluminum interconnections according to embodiments of the disclosure may utilize less power and operate at higher speeds.

The following description provides specific details, such as material types, material thicknesses, and process conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete description of an electronic device or a complete process flow for manufacturing the electronic device and the structures described below do not form a complete electronic device. Only those process acts and structures necessary to understand the embodiments described herein are described in detail below. Additional acts to form a complete electronic device may be performed by conventional techniques.

The materials described herein may be formed by conventional techniques including, but not limited to, spin coating, blanket coating, chemical vapor deposition (CVD), atomic layer deposition (ALD), plasma enhanced ALD, or physical vapor deposition (PVD). Alternatively, the materials may be grown. Depending on the specific material to be formed, the technique for depositing or growing the material may be selected by a person of ordinary skill in the art. The removal of materials may be accomplished by any suitable technique including, but not limited to, etching, abrasive planarization (e.g., chemical mechanical polishing (CMP)), or other known methods unless the context indicates otherwise.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, the singular forms "a," "an," and "the" are intended to include the plural forms as well, unless the context clearly indicates otherwise.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the term "hourglass shape" or "hourglass-shaped" means and includes a feature (e.g., an aluminum interconnect) having the greater width in the lateral direction at the first portion and at the third portion than the width in the lateral direction at the second portion, where the second portion is vertically oriented between the first portion and the third portion. The first portion exhibits the width in the lateral direction that is greater than or equal to the width in the lateral direction at the second portion. The first portion is proximal to a base material and the third portion is distal to the base material.

As used herein, the term "configured" refers to a size, shape, material composition, and arrangement of one or more of at least one structure and at least one apparatus facilitating operation of one or more of the structure and the apparatus in a pre-determined way.

As used herein, the term "contact" means and includes a connection facilitating a conductive pathway between at least two structures. For example, in a dynamic random access memory (DRAM) device exhibiting a dual bit memory cell structure, a digit line contact is provided between a digit line and an access device (e.g., a transistor) formed in or above a substrate, and storage node contacts are formed between the access device and a storage node (e.g., a capacitor) where electrical charge may be stored.

As used herein, the term "taper shape" or "taper-shaped" means and includes a feature (e.g., an aluminum interconnect) having the greater width in the lateral direction at the second portion than the width in the lateral direction at the first portion, where the second portion is vertically oriented between the first portion and the third portion. The width in the lateral direction at the third portion is greater than the width in the lateral direction at the second portion. The first portion is proximal to the base material and the third portion is distal to the base material.

As used herein, the term "selectively etchable" means and includes a material that exhibits a greater etch rate responsive to exposure to a given etch chemistry and/or process conditions relative to another material exposed to the same etch chemistry and/or process conditions. For example, the material may exhibit an etch rate that is at least about five times greater than the etch rate of another material, such as an etch rate of about ten times greater, about twenty times greater, or about forty times greater than the etch rate of the another material. Etch chemistries and etch conditions for selectively etching a desired material may be selected by a person of ordinary skill in the art.

As used herein, the term "electronic device" includes without limitation a memory device, as well as other electronic devices which may or may not incorporate memory, such as a logic device, a processor device, or a radiofrequency (RF) device. Further, an electronic device may incorporate memory in addition to other functions such as, for example, a so-called "system on a chip" (SoC) including a processor and memory, or an electronic device including logic and memory.

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99.0% met, or even at least 99.9% met.

As used herein, the term "substrate" means and includes a material (e.g., a base material) or construction upon which additional materials are formed. The substrate may be a semiconductor substrate, a base semiconductor material on a supporting structure, a metal electrode, or a semiconductor substrate having one or more materials, layers, structures, or regions formed thereon. The materials on the semiconductor substrate may include, but are not limited to, semiconductive materials, insulating materials, conductive materials, etc. The substrate may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

As used herein, the terms "vertical," "longitudinal," "horizontal," and "lateral" are in reference to a major plane of a structure and are not necessarily defined by Earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure.

As shown in FIG. 1, an electronic device 100 (e.g., an apparatus) includes first interconnections 102 at a first level L1, second interconnections 104 at a second level L2, third interconnections 106 at a third level L3, and fourth interconnections 108 at a fourth level L4. The electronic device 100, therefore, includes a multilevel wiring structure. The third interconnections 106 include third interconnections 106a, 106b, which include aluminum interconnections 106a, 106b according to embodiments of the disclosure. The third interconnections 106 are referred to generally as third interconnections 106, or individually as third interconnections 106a, 106b when referring to specific embodiments of the disclosure. The interconnections 102, 104, 106, 108 are oriented over one another (e.g., in a vertical direction), which is indicated in FIG. 1 as the y direction. The interconnections 102, 104, 106, 108 are vertically oriented relative to one another. Adjacent aluminum interconnections 106 of the third level L3 are laterally oriented (e.g., laterally adjacent) relative to one another and are separated from one other by air gaps 110. The lateral direction is indicated in FIG. 1 as the x direction. The aluminum interconnections 106a of the third interconnections 106 include sidewalls that exhibit an hourglass shape, with the sidewalls of the aluminum interconnections 106a defining the air gaps 110 between the adjacent aluminum interconnections 106a. The aluminum interconnections 106b of the third interconnections 106 include sidewalls that are tapered (e.g., narrowed proximal to the base material), with the sidewalls of the aluminum interconnections 106b defining the air gaps 110 between the adjacent aluminum interconnections 106b. The sidewalls of fourth insulating material 118, if present, may also define the air gaps 110 between the adjacent aluminum interconnections 106b. The third interconnections 106a, 106b may be present in the electronic device 100 of FIG. 1.

Each level of interconnection (e.g., wiring structure) is formed from an electrically conductive material and is isolated from electrically conductive materials of other levels of interconnections by one or more insulating materials. The interconnections 102, 104, 106, 108 provide conductive pathways through the electronic device 100. The interconnections 102, 104, 106, 108 may be electrically connected to one another by conductive structures, such as contacts 122. The contacts 122 may include, but are not limited to, contact plugs or contact vias. The first interconnections 102 may be electrically connected to the second interconnections 104, which are electrically connected to the third interconnections 106 through the contacts 122. The fourth interconnections 108 may be a component of a so-called "integrated" or "inline" redistribution layer (iRDL) of the electronic device 100 and are electrically connected to the third interconnections 106. While FIG. 1 shows four levels of interconnections 102, 104, 106, 108, the electronic device 100 may include more than four levels of interconnections.

The electrically conductive material may be a high conductivity metal material, a middle conductivity metal material, or a low conductivity metal material depending on desired performance properties (e.g., capacitance) of the electronic device 100. The electrically conductive material may be a metal, a metal alloy, a metal-containing material, a conductively-doped semiconductor material, or a combination thereof. The electrically conductive material may include, but is not limited to, aluminum, copper, gold, iridium, iridium oxide, molybdenum, molybdenum nitride, nickel, platinum, ruthenium, ruthenium oxide, ruthenium titanium nitride, silver, tantalum, tantalum nitride, tantalum silicide, titanium, titanium nitride, titanium silicide, titanium aluminum nitride, titanium silicon nitride, tungsten, tungsten nitride, an alloy thereof, a combination thereof, or conductively doped silicon. The high conductivity metal material may, for example, be copper, the middle conductivity metal material may, for example, be aluminum, and the low conductivity metal material may, for example, be tungsten. In some embodiments, the first interconnections 102 are formed of copper, the second interconnections 104 are formed of copper, the third interconnections 106a, 106b are formed of aluminum, and the fourth interconnections 108 include aluminum. The iRDL including the fourth interconnections 108 may also include a metal nitride material 128, a passivation material 130, a sixth insulating material 132, and a second liner 138. Therefore, the iRDL may be formed of multiple, electrically conductive materials, such as a titanium-aluminum-titanium nitride (Ti—Al—TiN) conductive structure. The iRDL is electrically connected to the underlying conductive materials (e.g., the first, second, and third interconnections 102, 104, 106) of the electronic device 100 through, for example, the contacts 122, which provide conductive pathways between the iRDL and the underlying first, second, and third interconnections 102, 104, 106.

The electronic device 100 includes the interconnections 102, 104, 106, 108 over (e.g., adjacent to, vertically adjacent to) a base material (not shown). A first insulating material 112 is adjacent to (e.g., laterally adjacent to) the first interconnections 102, a second insulating material 114 is adjacent to (e.g., laterally adjacent to) the second interconnections 104, a third insulating material 116 is adjacent to (e.g., laterally adjacent to) the third interconnections 106, and a fourth insulating material 118 is adjacent to (e.g., laterally adjacent to) at least a portion of the fourth interconnections 108. Other portions of the fourth interconnections 108 may be vertically adjacent to the fourth insulating material 118. A thickness of the insulating materials may be sufficient to electrically isolate electrically conductive materials from one another, such as the electrically conductive materials of the interconnections 102, 104, 106, 108 and the conductive structures. The first, second, and fourth insulating materials 112, 114, 118 may independently be silicon oxide, silicon nitride, or another insulating material. The third insulating material 116 may be air or air in combination with one or more gases. In some embodiments, the first and second insulating materials 112, 114 are a silicon oxide, such as silicon dioxide, the third insulating material 116 is air, such as the air gaps 110, and the fourth insulating material 118 is an interlayer insulating material, such as a silicon oxide.

The electronic device 100 may also include a diffusion barrier 120 over the second interconnections 104 and the second insulating material 114, as described in more detail below and illustrated in FIG. 4. The contact 122 is present between the second interconnections 104 and the third interconnections 106. The contact 122 may, for example, be configured as a plug and may be formed from one of the electrically conductive materials described above. In some embodiments, the contact 122 is formed of tungsten. A first liner 124 may be present between the contact 122 and a fifth insulating material 126. The fifth insulating material 126 may be one of the insulating materials described above. The electronic device 100 also includes a metal nitride material 128, a passivation material 130, and a sixth insulating material 132 over the fourth interconnections 108. The metal nitride material 128 may include titanium nitride, and the passivation material 130 may include, but is not limited to, silicon nitride or silicon oxynitride. The sixth insulating material 132 may be a polyimide material. Openings 134 in the sixth insulating material 132, the passivation material 130, and the metal nitride material 128 may include therein an electrically conductive material of the bond pads 136.

An interconnect structure 200A is shown in FIGS. 2A and 2B, which are enlarged views of the circled portion of FIG. 1. The interconnect structure 200A is present in the electronic device 100 of FIG. 1 as the third interconnections 106a. The interconnect structure 200A includes aluminum interconnections 106a (e.g., the third interconnections 106a) having a first portion 202, a second portion 204, and a third portion 206. The second portion 204 is positioned between the first portion 202 and the third portion 206. The first portion 202, the second portion 204, and the third portion 206 of the aluminum interconnections 106a may be substantially equal in length $L_1$ (e.g., in the y direction). The aluminum interconnections 106a may include three substantially equal portions, with the third portion 206 extending from an upper surface of the aluminum interconnections 106a to an upper surface of the second portion 204, and the first portion 202 extending from a lower surface of the aluminum interconnections 106a to a lower surface of the second portion 204. The second portion 204 may extend between an upper surface of the first portion 202 and a lower surface of the third portion 206. As shown in FIG. 2A, the fifth insulating material 126 is adjacent to (e.g., below) the aluminum interconnections 106a of the interconnect structure 200A and the fourth insulating material 118 is adjacent to (e.g., above) the aluminum interconnections 106a of the interconnect structure 200A. The fourth insulating material 118 may, optionally, also be present on the sidewalls of the aluminum interconnections 106a. The fourth insulating material 118 on the sidewalls of the aluminum interconnections 106a may define sidewalls of the air gaps 110. As shown in FIG. 2A, a metal material 210' may be adjacent to (e.g., below) the aluminum interconnections 106a and a metal nitride material 212' may be adjacent to (e.g., above) the aluminum interconnections 106a. The metal material 210' may, for example, be titanium and the metal nitride material 212' may, for example, be titanium nitride. The metal material 210' may be a metal as formed, and may subsequently form an alloy of the metal material 210' and aluminum of the aluminum interconnections 106a. In some embodiments, the metal material 210' is titanium as formed and is subsequently alloyed to form an aluminum/titanium alloy.

As shown most clearly in FIGS. 2A and 2B, the aluminum interconnections 106a exhibit the so-called "hourglass" cross-sectional shape, with the aluminum interconnections 106a exhibiting different widths at different locations in the y direction of the aluminum interconnections 106a. A width W1 of the first (e.g., bottom, lower) portion 202 of the aluminum interconnections 106a may be greater than or equal to a width W2 of the second (e.g., middle) portion 204. A width W3 of the third (e.g., top, upper) portion 206 of the aluminum interconnections 106a may be greater than the width W2 of the second (e.g., middle, center) portion 204. The width W1 is a maximum width within the first portion 202, the width W2 is a minimum width within the second portion 204, and the width W3 is a maximum width within the third portion 206. While FIGS. 2A and 2B show the width W1 as being proximal to the lower surface of the aluminum interconnections 106a (e.g., a lower surface of the first portion 202), the width W1 may be positioned at a different location within the first portion 202 depending on the location of the maximum width within the first portion 202. While FIGS. 2A and 2B show the width W2 as being substantially central to the second portion 204, the width W2 may be positioned at a different location within the second portion 204 depending on the location of the minimum width within the second portion 204. While FIGS. 2A and 2B show the width W3 as being proximal to the upper surface of the aluminum interconnections 106a (e.g., an upper surface of the third portion 206), the width W3 may be positioned at a different location within the third portion 206 depending on the location of the maximum width within the third portion 206.

Due to the hourglass shape of the aluminum interconnections 106a, any fourth insulating material 118 present on the sidewalls of the aluminum interconnections 106a may be decreased in thickness relative to a thickness of a similar material in conventional interconnections. In conventional interconnections, adjacent aluminum interconnections might be separated from one another by air gaps. However, a maximum width W7 of the air gaps 110 between the adjacent aluminum interconnections 106a according to embodiments of the disclosure is increased in the x direction relative to the corresponding width of the air gaps in conventional interconnections. The increased width W7 of the air gaps 110 reduces parasitic capacitance between the adjacent aluminum interconnections 106a. While the aluminum interconnections 106a according to embodiments of the disclosure and conventional interconnections may be formed at substantially the same pitch, the width W7 of the air gaps 110 may be greater with the aluminum interconnections 106a than with conventional interconnections. The increased width W7 of the air gaps 110 may correspond in location to the width W2 of the aluminum interconnections 106a.

An additional embodiment of an interconnect structure 200B is shown in FIGS. 3A and 3B and includes aluminum interconnections 106b (e.g., the third interconnections 106b) having the first portion 202, the second portion 204, and the third portion 206. The second portion 204 is positioned between the first portion 202 and the third portion 206, as described above in relation to FIGS. 2A and 2B. As described in more detail below, the interconnect structure 200B is similar to that of interconnect structure 200A (see FIGS. 2A and 2B), except the sidewalls of the aluminum interconnections 106b are tapered rather than being hourglass-shaped. The tapered cross-sectional shape of the aluminum interconnections 106b exhibits different widths at different locations in the y direction of the aluminum interconnections 106b. The first, second, and third portions 202, 204, 206 of the aluminum interconnections 106b may be substantially equal in length $L_1$ (e.g., in the y direction). The aluminum interconnections 106b exhibit the tapered cross-sectional shape, with the aluminum interconnections 106b exhibiting different widths W4, W5, and W6 in the x direction. The width W4 of the first (e.g., bottom) portion 202 of the aluminum interconnections 106b is less than the width W5 of the second (e.g., middle) portion 204 and the width W6 of the third (e.g., top) portion 206 is greater than the width W5 of the second (e.g., middle) portion 204. The width W4 is a maximum width within the first portion 202, the width W5 is the minimum width within the second portion 204, and the width W6 is the maximum width within the third portion 206. While FIGS. 3A and 3B show the width W4 as being proximal to the lower surface of the aluminum interconnections 106b (e.g., a lower surface of the first portion 202), the width W4 may be positioned at a different location within the first portion 202 depending on the location of the maximum width within the first portion 202. While FIGS. 3A and 3B show the width W5 as being substantially central to the second portion 204, the width W5 may be positioned at a different location within the second portion 204 depending on the location of the minimum width within the second portion 204. While FIGS. 3A and 3B show the width W6 as being proximal to the upper surface of the aluminum interconnections 106b (e.g., an upper surface of the third portion 206), the width W6 may be positioned at a different location within the third portion 206 depending on the location of the maximum width within the third portion 206.

The interconnect structure 200B is present in the electronic device 100 of FIG. 1 and includes the first interconnections 102 at the first level L1, the second interconnections 104 at the second level L2, the third interconnections 106b at the third level L3, and the fourth interconnections 108 at the fourth level L4, with the first, second, and fourth interconnections 102, 104, 108 as described above in relation to FIG. 1. Each level of wiring structure (e.g., interconnection) is formed from one of the electrically conductive materials described above in relation to FIG. 1 and is isolated from other levels of wiring structures (e.g., interconnections) by the insulating materials described above in relation to FIG. 1. The interconnections 102, 104, 106b, 108 may be coupled to one another by additional conductive structures, such as contact plugs or contact vias. The electronic device 100 includes the interconnections 102, 104, 106b, 108 over (e.g., vertically adjacent to) the base material (not shown), the insulating materials 112, 114, 116, 118, the fifth insulating material 126, the diffusion barrier 120, the first liner 124, the metal nitride material 128, the passivation material 130, and the sixth insulating material 132 as described above in relation to FIG. 1.

The tapered shape of the aluminum interconnections 106b enables any fourth insulating material 118 present on the sidewalls of the aluminum interconnections 106b to be decreased in thickness relative to a thickness of a similar material in conventional interconnections. In conventional interconnections, adjacent aluminum interconnections might be separated from one another by air gaps. However, a maximum width W8 of the air gaps 110 between the adjacent aluminum interconnections 106b according to embodiments of the disclosure is increased in the x direction relative to the corresponding width of the air gaps in conventional interconnections. The increased width W8 of the air gaps 110 reduces parasitic capacitance between the adjacent aluminum interconnections 106b. While the aluminum interconnections 106b according to embodiments of the disclosure and conventional interconnections may be formed at substantially the same pitch, the width W8 of the air gaps 110 may be greater with the aluminum interconnections 106b than with conventional interconnections. The increased width W8 of the air gaps 110 may correspond in location to the width W5 of the aluminum interconnections 106b.

Figure 4:
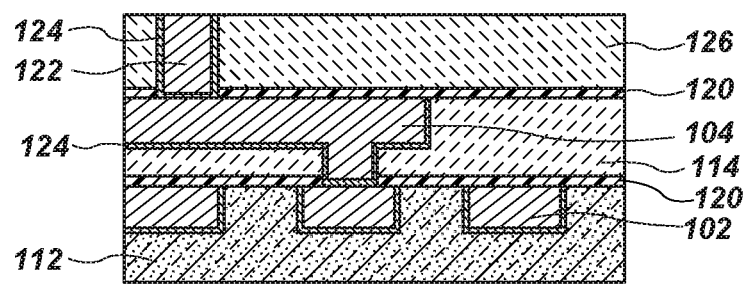
FIGS. 4-11 various stages of forming the electronic device of FIG. 1 in accordance with some embodiments of the disclosure.

To form the aluminum interconnections 106a of FIGS. 2A and 2B, the first interconnections 102 at the first level L1 are formed in the first insulating material 112 on the base material (not shown), as shown in FIG. 4. The electrically conductive material of the first interconnections 102 may, for example, be copper. The second interconnections 104 at the second level L2 are formed on the first interconnections 102 and in the second insulating material 114. The electrically conductive material of the second interconnections 104 may, for example, be copper. The first and second insulating materials 112, 114 may be an oxide, such as silicon dioxide. The first and second interconnections 102, 104 are formed by conventional techniques, such as by single damascene or dual damascene techniques. The diffusion barriers 120 may be formed over the first and second interconnections 102, 104 by conventional techniques. The diffusion barrier 120 may be formed of silicon nitride (SiN) or silicon carbonitride (SiCN). The diffusion barrier 120 may be formed to a thickness of from about 20 nm to about 100 nm, such as from about 40 nm to about 80 nm, from about 40 nm to about 70 nm, from about 40 nm to about 60 nm, or from about 45 nm to about 55 nm. In some embodiments, the diffusion barrier 120 is formed at a thickness of about 50 nm.

The fifth insulating material 126, such as silicon dioxide, is formed over the diffusion barrier 120. The fifth insulating material 126 may be formed by conventional techniques and at a thickness of from about 100 nm to about 500 nm, such as from about 200 nm to about 450 nm, from about 250 nm to about 400 nm, from about 250 nm to about 375 nm, from about 275 nm to about 375 nm, from about 300 nm to about 375 nm, or from about 300 nm to about 400 nm. In some embodiments, the fifth insulating material 126 is silicon oxide and is formed by CVD at a thickness of about 350 nm. Contact holes (not shown), such as via holes, may be formed in the fifth insulating material 126 by conventional photolithography and removal (e.g., dry etch) techniques. The contact holes may be defined by sidewalls of the fifth insulating material 126. The first liner 124 is formed in the contact holes and on the sidewalls of the fifth insulating material 126 and an electrically conductive material is formed in the remainder of the contact holes to form the contact 122 (e.g., a conductive plug). The first liner 124 may be formed of titanium or titanium nitride, such as by PVD, at a thickness of from about 10 nm to about 25 nm, such as from about 10 nm to about 20 nm, from about 15 nm to about 20 nm, or from about 12 nm to about 19 nm. The electrically conductive material may be formed in the contact holes to substantially fill the contact holes and form the contacts 122. The electrically conductive material of the contacts 122 may be a metal including, but not limited to, tungsten. Excess electrically conductive material over the fifth insulating material 126 may be removed, such as by an abrasive planarization act, to form the contacts 122. The abrasive planarization act may, for example, be a CMP act. In some embodiments, the contact 122 is a tungsten plug.

Figure 5:
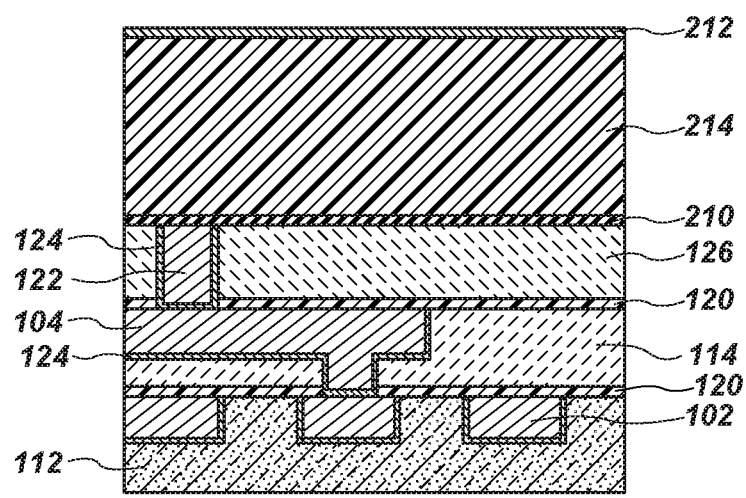

As shown in FIG. 5, the metal material 210 may be formed over the fifth insulating material 126 and the contact 122. The metal material 210 may be titanium and formed at a thickness of from about 5 nm to about 15 nm, such as from about 7 nm to about 12 nm, from about 8 nm to about 12 nm, or from about 10 nm to about 12 nm. In some embodiments, the thickness of the metal material 210 is about 10 nm. An aluminum material 214 may be formed over the metal material 210, and a metal nitride material 212, such as titanium nitride, may be formed over the aluminum material 214. The aluminum material 214 may be formed at a thickness of from about 400 nm to about 800 nm, such as from about 400 nm to about 650 nm, from about 450 nm to about 600 nm, or from about 500 nm to about 600 nm. In some embodiments, the thickness of the aluminum material 214 is about 550 nm. The thickness of the aluminum material 214 may correspond to the height of the aluminum interconnections 106a ultimately to be formed in the electronic device 100. The metal nitride material 212 may be formed at a thickness of from about 5 nm to about 18 nm, such as from about 7 nm to about 17 nm, from about 8 nm to about 16 nm, from about 12 nm to about 18 nm, or from about 14 nm to about 18 nm. In some embodiments, the metal nitride material 212 is formed at a thickness of about 15 nm.

Figure 6:
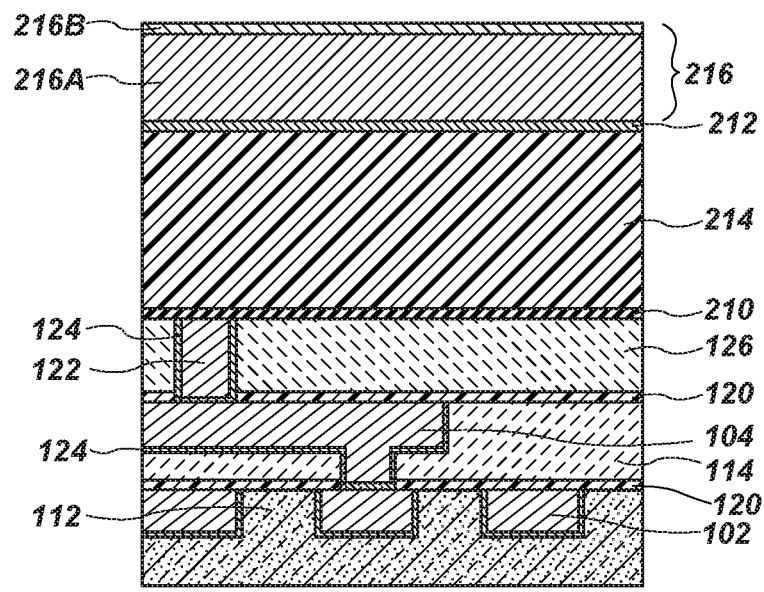

A hardmask 216 may be formed over the metal nitride material 212. The hardmask 216 may be a single material or may include multiple hardmask materials 216A, 216B, as shown in FIG. 6. The hardmask 216 may include, but is not limited to, a carbon material, an antireflective material, or other selectively etchable material. By way of example only, the carbon material may be amorphous carbon and the antireflective material may be silicon oxynitride. In some embodiments, the hardmask 216A, 216B includes amorphous carbon directly over the metal nitride material 212 and silicon oxynitride directly over the amorphous carbon. The hardmask 216 may be formed at a thickness of from about 350 nm to about 450 nm, such as from about 375 nm to about 425 nm, from about 350 nm to about 400 nm, from about 375 nm to about 400 nm, or from about 400 nm to about 450 nm.

Figure 7:
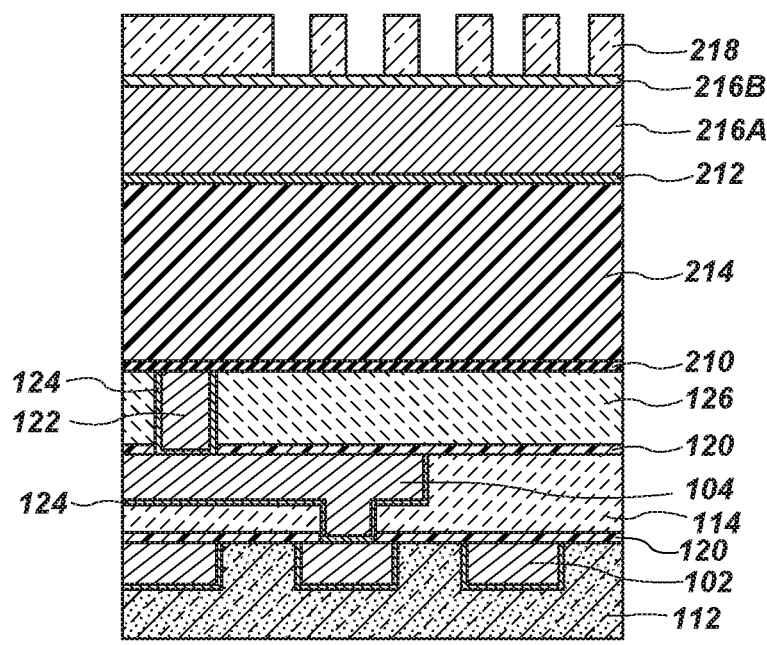
Figure 8:
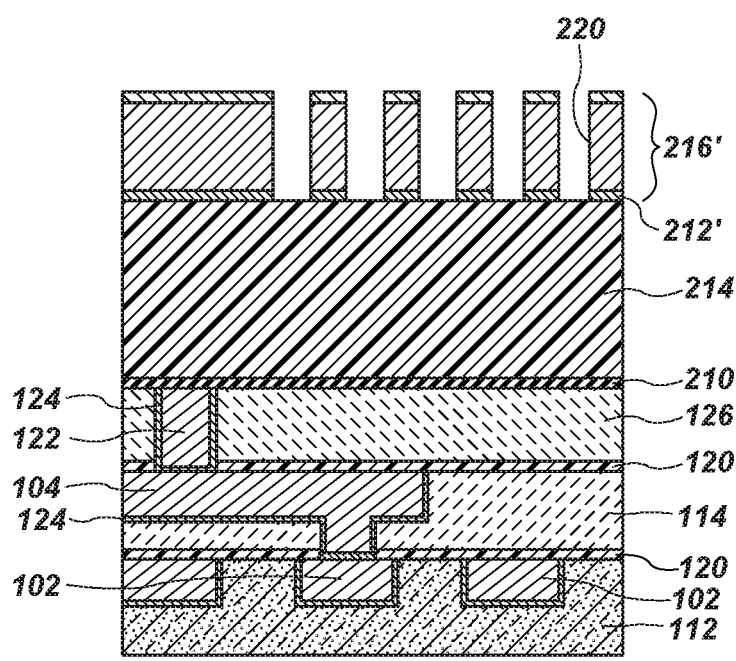

A photoresist material may be formed over the hardmask 216 and patterned to form a patterned photoresist 218, as shown in FIG. 7. The photoresist material may be formed and patterned by conventional techniques, such as by conventional photolithography and removal (e.g., etch) techniques. A pattern in the patterned photoresist 218 may correspond to a pattern ultimately to be formed in the aluminum material 214. The patterned photoresist 218 may be used as a mask to remove underlying portions of the hardmask 216, such as by a removal (e.g., an etch) act, as shown in FIG. 8. By way of example only, exposed portions of the hardmask 216 may be removed by a plasma etch process to form a patterned hardmask 216'. The plasma etch process may include, for example, argon gas and oxygen. The patterned hardmask 216' may exhibit substantially vertical sidewalls 220 following the plasma etch process. The patterned photoresist 218 may then be removed.

Figure 9:
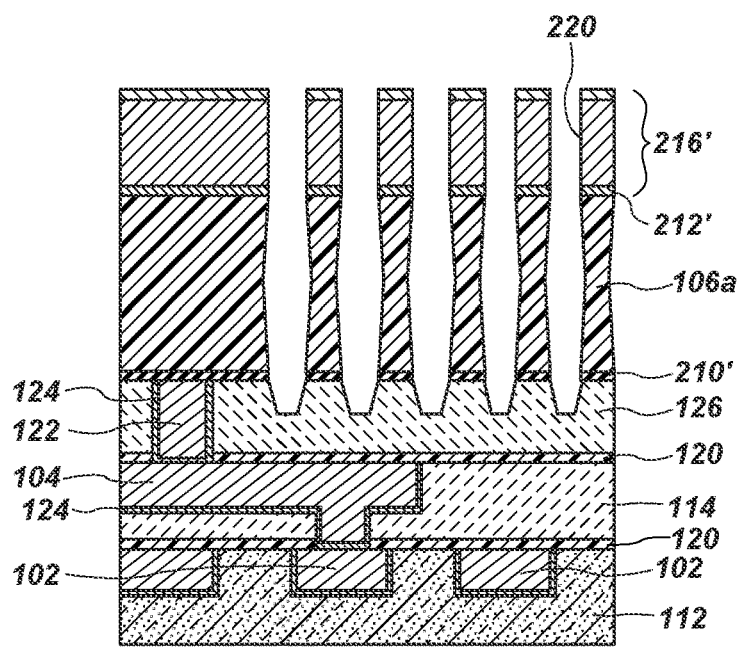

The patterned hardmask 216' may be used as a mask to remove underlying portions of the metal nitride material 212, the aluminum material 214, and the metal material 210. The portions of the metal nitride material 212, the aluminum material 214, and the metal material 210 are removed, for example, using a gas of ethane ($C_2H_4$), to form patterned metal nitride material 212', the aluminum interconnections 106a, and patterned metal nitride material 210', as shown in FIG. 9. The sidewalls of the aluminum interconnections 106a exhibit the hourglass shape, with the width W2 of the second portion 204 less than the width W3 of the third portion 206. The width W2 of the second portion 204 is also less than or equal to the width W1 of the first portion 202. As shown in FIGS. 2A, 2B, 9 and 10, the sidewalls of the aluminum interconnections 106a are substantially non-vertical following the patterning of the aluminum material 214. The adjacent aluminum interconnections 106a may be separated from one another by openings (e.g., air gaps 110), with the aluminum interconnections 106a exhibiting the hourglass shape in cross-section. The shape of the openings is defined by the sidewalls of the aluminum interconnections 106a and may substantially correspond to the shape of the air gaps 110.

Figure 10:
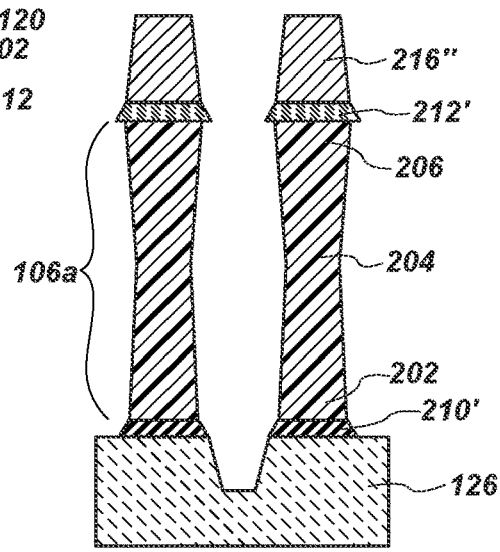

The hourglass shape of the aluminum interconnections 106a may occur as the result of the removal conditions (the etch chemistry and etch conditions) used to form the aluminum interconnections 106a. Without being bound by any theory, as the portions of the aluminum material 214 and the metal material 210 are removed using the patterned hardmask 216' as a mask, a portion of the patterned hardmask 216' may also be removed, as shown in FIG. 10, forming sloped patterned hardmask 216". When exposed to the etch chemistry and etch conditions for forming the aluminum interconnections 106a, the sidewalls of the patterned hardmask 216' become sloped relative to the substantially vertical sidewalls 220 of the patterned hardmask 216' following the plasma etch process (see FIG. 8). The etch chemistry and etch conditions for forming the aluminum interconnections 106a, therefore, remove additional portions of the patterned hardmask 216' and form the sloped patterned hardmask 216". The sloped patterned hardmask 216" affects an orbit of etchant species generated during the etch of the aluminum interconnections 106a, which causes the etchant species to impact the sidewalls of the aluminum interconnections 106a and result in the hourglass shape of the aluminum interconnections 106a. Any oxide material formed between the aluminum interconnections 106a may be selectively removed (e.g., selectively etched) using argon gas.

It was unexpected for the hourglass shape of the aluminum interconnections 106a to occur at a pitch between adjacent aluminum interconnections 106a of less than about 400 nm and spacing of less than about 200 nm. When forming the aluminum interconnections 106a at a line/spacing of about 150 nm/150 nm, the second portion 204 of the aluminum interconnections 106a exhibited a smaller width W2 than the widths W1, W3 of the first portion 202 and the third portion 206, respectively. The width W2 of the second portion 204 was about 13% less than the widths W1, W3 of the first portion 202 and the third portion 206, respectively. By way of example only, the first portion 202 of the aluminum interconnections 106a may exhibit a width W1 of about 159 nm, the second portion 204 of the aluminum interconnections 106a may exhibit a width W2 of about 132 nm, and the third portion 206 of the aluminum interconnections 106a may exhibit a width W3 of about 153 nm. For the aluminum interconnections 106a formed at the line/spacing of about 150 nm/150 nm, stray capacitance of an electronic device containing the aluminum interconnections 106a was measured to be 0.1586 fF/μm compared to a stray capacitance of 0.1673 fF/μm for an electronic device containing conventional aluminum interconnections. A 5.2% reduction in stray capacitance was, therefore, observed.

Figure 11:
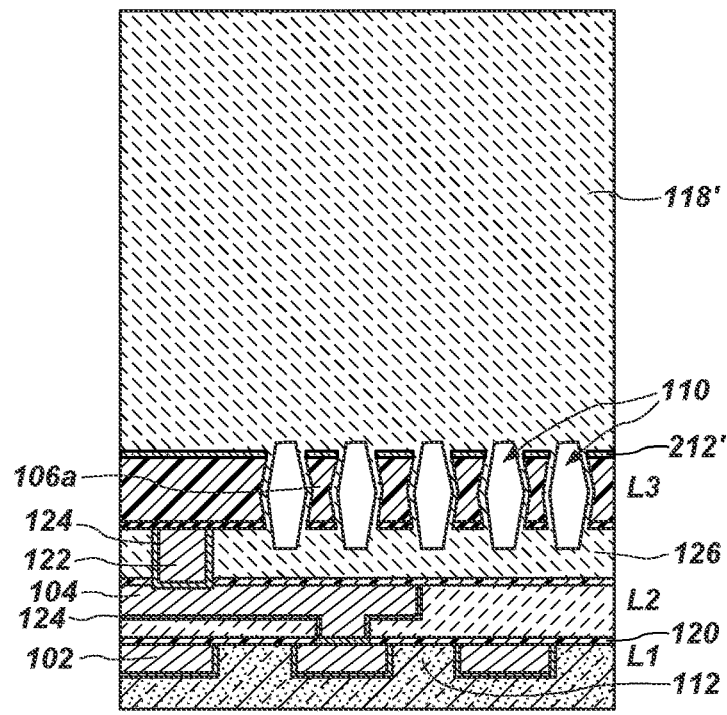

The patterned hardmask 216' may be removed, such as by ashing, and the fourth insulating material 118' formed over an upper surface of the aluminum interconnections 106a, as shown in FIG. 11, to form the air gaps 110 between the aluminum interconnections 106a. The fourth insulating material 118' may, for example, be an oxide material, formed on the upper surface of the aluminum interconnections 106a without substantially forming the fourth insulating material 118' in the air gaps 110. A small amount of the fourth insulating material 118' may, however, form on the sidewalls of the aluminum interconnections 106a in the air gaps 110 and define sidewalls of the air gaps 110. In some embodiments, the fourth insulating material 118' is a silicon oxide exhibiting poor coverage and the silicon oxide is formed by a plasma CVD process. The air gaps 110, therefore, are present between the adjacent aluminum interconnections 106a. A thickness of the fourth insulating material 118' may be from about 1 μm to about 20 μm, such as from about 5 μm to about 15 μm, or from about 5 μm to about 10 μm.

Openings (not shown) in the fourth insulating material 118 may be formed by conventional techniques and a second liner 138 formed in the openings and over an upper surface of the fourth insulating material 118. See FIG. 1. The second liner 138 may be a metal nitride material and may be formed at a thickness of from about 20 nm to about 100 nm, such as from about 40 nm to about 80 nm, from about 45 nm to about 75 nm, or from about 45 nm to about 55 nm. The electrically conductive material of the fourth interconnections 108 may be formed over the second liner 138, within the openings, and over the upper surface of the fourth insulating material 118, as shown in FIG. 1. The metal nitride material 128, the passivation material 130, the sixth insulating material 132 (e.g., the polyimide material), and the electrically conductive material of the bond pads 136 may be formed over the fourth interconnections 108, as shown in FIG. 1. The metal nitride material 128 may include titanium nitride, and the passivation material 130 may include, but is not limited to, silicon nitride. The metal nitride material 128 may be formed at a thickness of from about 10 nm to about 80 nm, such as from about 15 nm to about 70 nm, from about 20 nm to about 75 nm, or from about 20 nm to about 55 nm. The passivation material 130 may be formed at a thickness of from about 200 nm to about 1000 nm, such as from about 300 nm to about 900 nm, from about 400 nm to about 900 nm, or from about 500 nm to about 850 nm. The fourth interconnections 108 may be formed at a thickness of from about 1 μm to about 20 μm, such as from about 2 μm to about 15 μm, from about 3 μm to about 10 μm, or from about 4 μm to about 8 μm. In some embodiments, the second liner 138 is titanium at a thickness of about 50 nm, the fourth interconnections 108 are aluminum interconnections at a thickness of about 4.5 μm, the metal nitride material 128 is titanium nitride at a thickness of about 25 nm, and the passivation material 130 is silicon nitride at a thickness of about 800 nm. The second liner 138, the fourth interconnections 108, the metal nitride material 128, the passivation material 130, the sixth insulating material 132, and the bond pads 136 may be formed by conventional techniques. The sixth insulating material 132 may be planarized, such as by a CMP act. The openings 134 may be formed through the sixth insulating material 132, the passivation material 130, and the metal nitride material 128, and subsequently filled with a metal or other conductive material to form the bond pads 136, as shown in FIG. 1.

Figure 12:
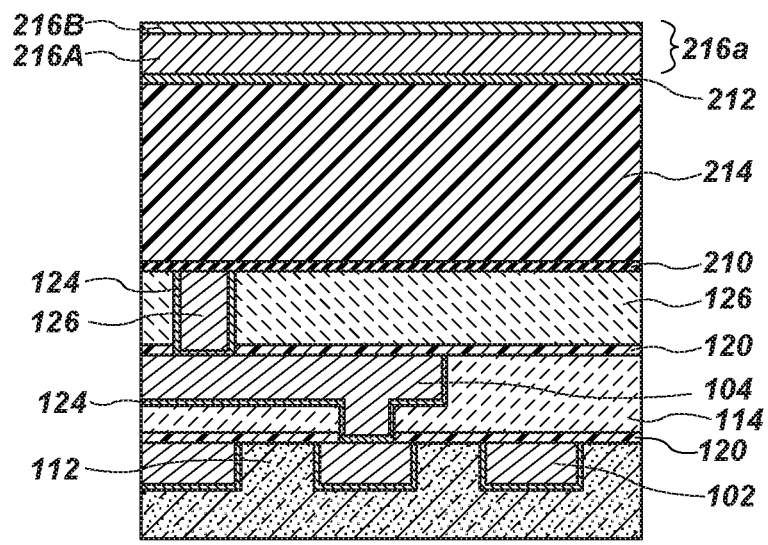
FIGS. 12-16 various stages of forming the electronic device of FIG. 1 in accordance with other embodiments of the disclosure.
Figure 13:
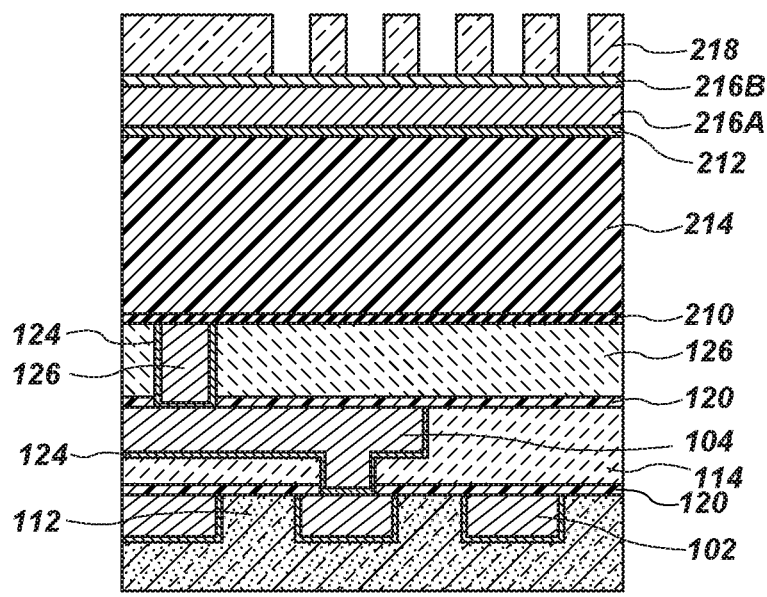
Figure 14:
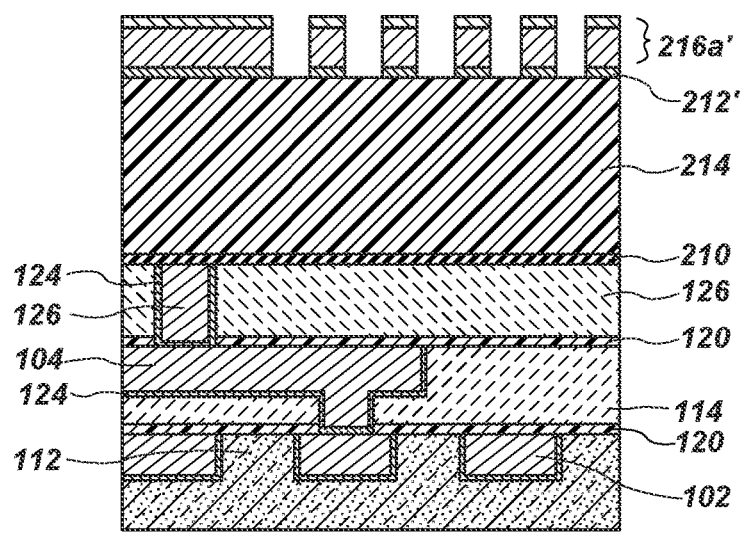
Figure 15:
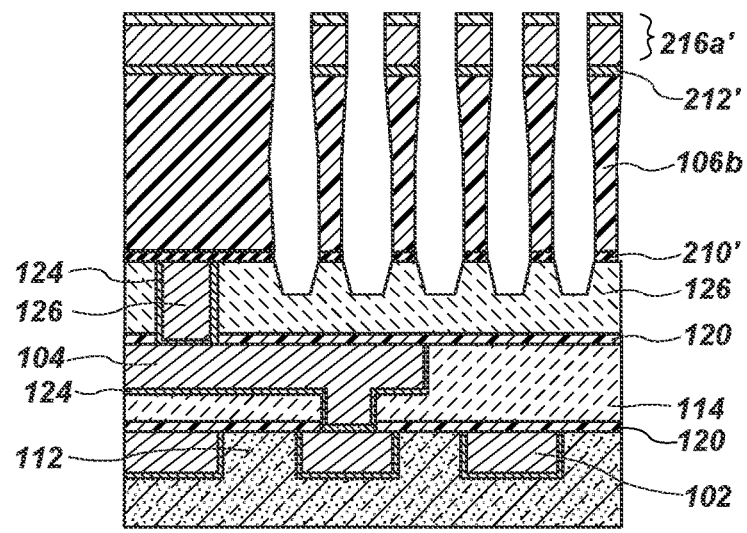
Figure 16:
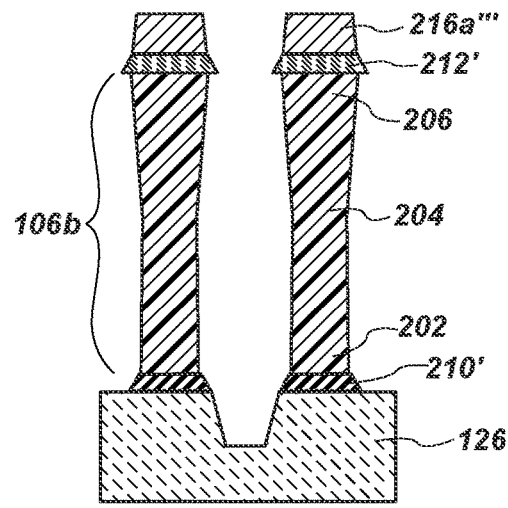

To form the aluminum interconnections 106b having the tapered shape, the process acts described above and illustrated in FIGS. 4-11 may be conducted. However, a relative thickness at which a hardmask 216a is formed is less than the thickness of the hardmask 216 described above for FIG. 6. As shown in FIG. 12, the thickness of the hardmask 216a is less than the thickness of the hardmask 216 and may be from about 100 nm to about 400 nm, such as from about 150 nm to about 300 nm, from about 150 nm to about 400 nm, from about 175 nm to about 300 nm, from about 175 nm to about 400 nm, from about 200 nm to about 300 nm, from about 200 nm to about 400 nm, from about 250 nm to about 300 nm, or from about 250 nm to about 400 nm. The patterned photoresist 218 may be used as a mask to pattern the hardmask 216 and the patterned hardmask 216a' may be used as a mask to pattern the aluminum material 214, as shown in FIGS. 13-15. The patterned hardmask 216a' includes substantially vertical sidewalls 220. Since, however, the hardmask 216a is initially formed at a lower thickness, different portions of the aluminum interconnections 106b are exposed to the ionic species of the etch chemistry than are exposed when using a thicker hardmask 216. As the exposed portions of the aluminum material 214 and the metal material 210 are selectively removed, a portion of the patterned hardmask 216a' is also removed, as shown in FIG. 16, forming sloped patterned hardmask 216a'''. Sidewalls of the sloped patterned hardmask 216a''' may be sloped compared to the substantially vertical sidewalls of the patterned hardmask 216a' following the plasma etch process (see FIG. 14). The removal conditions for forming the aluminum interconnections 106b, therefore, also selectively remove portions of the patterned hardmask 216a'. The decreased thickness and the sloped sidewalls of the sloped patterned hardmask 216a''' affect an orbit of etchant species generated during the etch of the aluminum interconnections 106b, resulting in the taper shape of the aluminum interconnections 106b, as shown in FIG. 16. The etchant species may impact the sidewalls of the aluminum interconnections 106b and result in the tapered shape of the aluminum interconnections 106b. Any oxide material formed between the aluminum interconnections 106b may be selectively removed (e.g., selectively etched) using argon gas. After forming the aluminum interconnections 106b, the electronic device 100 may be further processed as described above in relation to FIGS. 1 and 11.

Accordingly, an apparatus is disclosed. The apparatus comprises a multilevel wiring structure comprising aluminum interconnections. The aluminum interconnections comprise a first portion, a second portion, and a third portion, where the second portion is between the first portion and the third portion. The third portion comprises a greater width in a lateral direction than a width in the lateral direction of the second portion.

Accordingly, an apparatus is disclosed and comprises first and second interconnect structures, each of the first and second interconnect structures comprises a first portion, a second portion adjacent to the first portion, and a third portion adjacent to the second portion. The third portion comprises a greater width in a lateral direction than a width in the lateral direction of the second portion to form an air gap between the first and second interconnect structures.

Accordingly, a method of forming an apparatus is disclosed. The method comprises forming an aluminum material adjacent interconnections of a multilevel wiring structure. A patterned photoresist is formed adjacent to a hardmask, which is adjacent to the aluminum material. A portion of the hardmask exposed through the patterned hardmask is removed to form aluminum interconnections. The aluminum interconnections comprise a greater width in a lateral direction of an upper portion of the aluminum interconnections than a width in the lateral direction of a middle portion of the aluminum interconnections.

Figure 17:
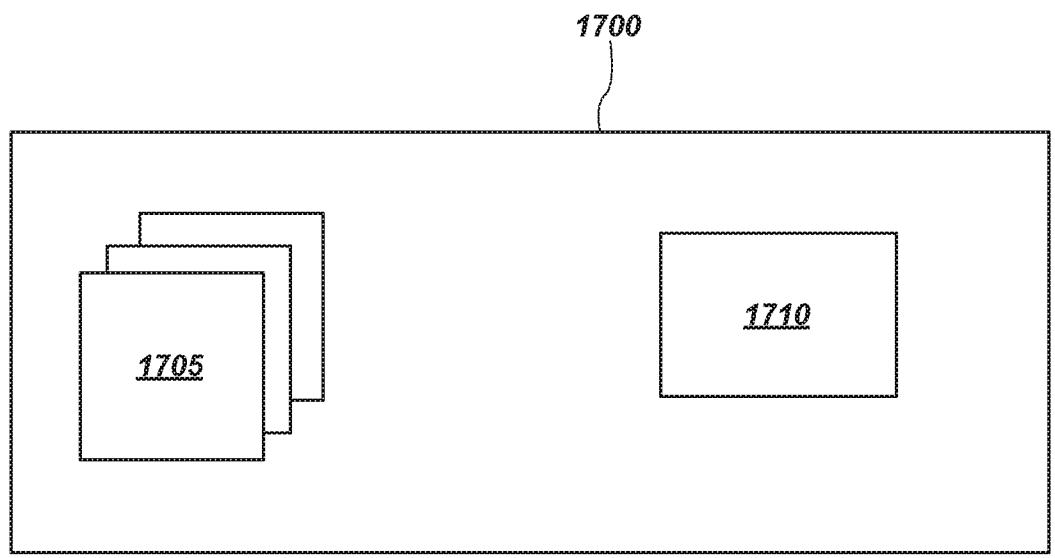
FIG. 17 is a schematic block diagram illustrating a memory device including one or more of the electronic devices in accordance with embodiments of the disclosure.

The electronic device 100 including the third interconnections 106 (e.g., third interconnections 106a or third interconnections 106b) may be used in a memory device (e.g., a DRAM memory device). Additional processing acts may be conducted to form a complete electronic device 100 that includes the third interconnections 106 according to embodiments of the disclosure. The subsequent process acts may be conducted by conventional techniques, which are not described in detail herein. The electronic devices 100 according to embodiments of the disclosure may be used in a memory device 1700 that includes a memory array 1705 of memory cells. The memory device 1700 (e.g., a DRAM device) is shown schematically in the functional block diagram of FIG. 17. The memory device 1700 includes the memory array 1705 of memory cells including one or more electronic devices 100 including the third interconnections 106 (e.g., the third interconnections 106a, the third interconnections 106b) and a control logic component 1710. The control logic component 1710 may be configured to operatively interact with the memory array 1705 so as to read, write, or re-fresh any or all memory cells within the memory array 1705.

Accordingly, a memory device comprising a memory array comprising memory cells and a control logic component electrically connected to the memory array is disclosed. At least one of the memory cells comprises a multilevel wiring structure comprising interconnect structures, where the interconnect structures comprise a first portion, a second portion adjacent to the first portion, and a third portion adjacent to the second portion. The third portion comprises a greater width in a lateral direction than a width in the lateral direction of the second portion.

Figure 18:
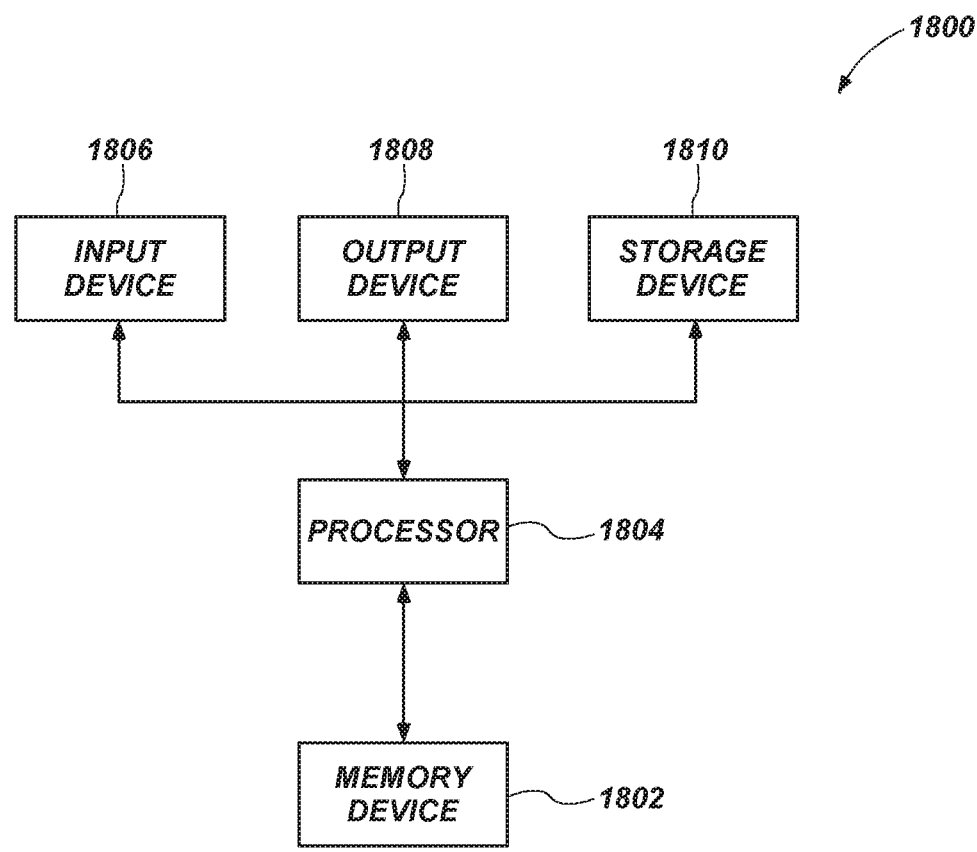
FIG. 18 is a schematic block diagram illustrating an electronic system including one or more of the electronic devices in accordance with embodiments of the disclosure.

An electronic system 1800 is also disclosed, as shown in FIG. 18, and includes the electronic device 100. FIG. 18 is a simplified block diagram of the electronic system 1800 implemented according to one or more embodiments described herein. The electronic system 1800 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, a navigation device, etc. The electronic system 1800 includes at least one electronic device 100, which includes memory cells including one or more third interconnections 106 (e.g., the third interconnections 106a, the third interconnections 106b) as previously described. The system 1800 may further include at least one processor device 1804 (often referred to as a "processor"). The processor device 1804 may, optionally, include one or more third interconnections 106 (e.g., the third interconnections 106a, the third interconnections 106b) as previously described. The system 1800 may further include one or more input devices 1806 for inputting information into the electronic system 1800 by a user, such as, for example, a mouse or other pointing device, a keyboard, a touchpad, a button, or a control panel. The electronic system 1800 may further include one or more output devices 1808 for outputting information (e.g., visual or audio output) to a user such as, for example, a monitor, a display, a printer, an audio output jack, a speaker, etc. In some embodiments, the input device 1806 and the output device 1808 may comprise a single touchscreen device that can be used both to input information to the electronic system 1800 and to output visual information to a user. The one or more input devices 1806 and output devices 1808 may communicate electrically with at least one of the memory device 1802 and the processor device 1804. The system 1800 may further include one or more storage devices 1810.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. An apparatus comprising:
a multilevel wiring structure comprising aluminum interconnections, the aluminum interconnections being homogeneous in material composition and comprising a first portion, a second portion, and a third portion, the second portion between the first portion and the third portion, at least one of the first portion and the third portion comprising a greater width in a lateral direction than a width in the lateral direction of the second portion.

2. The apparatus of claim 1, wherein the aluminum interconnections comprise an hourglass cross-sectional shape.

3. The apparatus of claim 1, wherein the aluminum interconnections comprise a first tapered cross-sectional shape and a second tapered cross-sectional shape.

4. The apparatus of claim 1, wherein the width in the lateral direction of the first portion is greater than the width in the lateral direction of the second portion.

5. The apparatus of claim 1, wherein the width in the lateral direction of the first portion is substantially equal to the width in the lateral direction of the second portion.

6. The apparatus of claim 1, wherein the width in the lateral direction of the first portion is less than the width in the lateral direction of the second portion.

7. The apparatus of claim 1, further comprising additional interconnections electrically connected to the aluminum interconnections.

8. The apparatus of claim 7, wherein the additional interconnections comprise copper interconnections.

9. The apparatus of claim 7, wherein the additional interconnections comprise additional aluminum interconnections.

10. The apparatus of claim 1, wherein the aluminum interconnections are electrically isolated from one another by air gaps, the air gaps having a maximum width laterally adjacent to the second portion of the aluminum interconnections.

11. A memory device, comprising:
a memory array comprising memory cells, at least one of the memory cells comprising:
a multilevel wiring structure comprising interconnect structures, the interconnect structures comprising a first portion of a material, a second portion of the material adjacent to the first portion of the material, and a third portion of the material adjacent to the second portion of the material, the third portion of the material comprising a greater width in a lateral direction than a width in the lateral direction of the second portion of the material, a first slope of sidewalls of the interconnect structures extending between the third portion of the material and the second portion of the material different than a second slope of sidewalls of the interconnect structures extending between the second portion of the material and the first portion of the material; and
a control logic component electrically connected to the memory array.

12. The memory device of claim 11, wherein the first slope of sidewalls comprises a first taper and the second slope of sidewalls comprises either a second taper or a substantially vertical slope.

13. The memory device of claim 11, wherein the interconnect structures comprise a tapered cross-sectional shape, the first portion of the material of the interconnect structures comprising a tapered end.

14. The memory device of claim 11, wherein the first portion of the material, the second portion of the material, and the third portion of the material of the interconnect structures are substantially equal in length.

15. The memory device of claim 11, wherein adjacent interconnect structures are separated from one another by air gaps.

16. The memory device of claim 15, wherein the air gaps are defined by the sidewalk of the interconnect structures.

17. The memory device of claim 15, wherein the air gaps are defined by an insulating material on the sidewalls of the interconnect structures.

18. The memory device of claim 11, further comprising interconnections electrically connected to the interconnect structures.

19. An apparatus, comprising:
first and second aluminum interconnect structures, each of the first and second aluminum interconnect structures comprises a first portion, a second portion adjacent to the first portion, and a third portion adjacent to the second portion, the third portion tapering from a greater width in a lateral direction distal to the second portion to a relatively lesser width in the lateral direction proximal to the second portion and the first portion tapering from a greater width in the lateral direction distal to the second portion to a relatively lesser width in the lateral direction proximal to the second portion to form an air gap between the first and second aluminum interconnect structures, the air gap having a maximum width laterally adjacent to the second portions of the first and second interconnect structures.

20. The apparatus of claim 19, wherein each of the first and second aluminum interconnect structures comprises an hourglass cross-sectional shape.

21. The apparatus of claim 19, wherein each of the first and second aluminum interconnect structures comprises a tapered cross-sectional shape.

22. The apparatus of claim 19, wherein the air gap comprises a minimum width defined by sidewalk of an insulating material above or beneath the first aluminum interconnect structure and the second aluminum interconnect structure.

23. A method of forming an apparatus, comprising:
forming an aluminum material adjacent interconnections of a multilevel wiring structure;
forming a patterned photoresist adjacent to a hardmask adjacent to the aluminum material;
removing a portion of the hardmask exposed through the patterned photoresist to form a patterned hardmask; and
removing a portion of the aluminum material exposed through the patterned hardmask to form aluminum interconnections, the aluminum interconnections comprising a first portion, a second portion, and a third portion, the second portion between the first portion and the third portion, the aluminum interconnections being homogeneous in material composition, and at least one of the first portion and the third portion comprising a greater width in a lateral direction than a width in the lateral direction of the second portion.

24. The method of claim 23, wherein removing a portion of the hardmask exposed through the patterned photoresist to form a patterned hardmask comprises forming the patterned hardmask comprising substantially vertical sidewalls.

25. The method of claim 23, wherein removing a portion of the aluminum material exposed through the patterned hardmask to form aluminum interconnections comprises substantially simultaneously removing a portion of the patterned hardmask to form a sloped patterned hardmask.

26. The method of claim 25, wherein substantially simultaneously removing a portion of the patterned hardmask to form a sloped patterned hardmask comprises forming the patterned hardmask comprising sloped sidewalls.

27. The method of claim 23, wherein removing a portion of the aluminum material exposed through the patterned hardmask to form aluminum interconnections comprises removing the portion of the aluminum material using ethane.

28. The method of claim 23, wherein removing a portion of the aluminum material exposed through the patterned hardmask to form aluminum interconnections comprises forming the aluminum interconnections comprising the first portion of the aluminum interconnections comprising a greater width in the lateral direction than the width in the lateral direction of the second portion.

29. The method of claim 23, wherein removing a portion of the aluminum material exposed through the patterned hardmask to form aluminum interconnections comprises forming the aluminum interconnections comprising the first portion of the aluminum interconnections comprising a smaller width in the lateral direction than the width in the lateral direction of the second portion.

* * * * *

UNITED STATES PATENT AND TRADEMARK OFFICE
CERTIFICATE OF CORRECTION

PATENT NO.         : 11,587,870 B2
APPLICATION NO.    : 16/539437
DATED              : February 21, 2023
INVENTOR(S)        : Sugioka et al.

It is certified that error appears in the above-identified patent and that said Letters Patent is hereby corrected as shown below:

In the Claims

| Claim 16, | Column 17, | Line 37, | change "the sidewalk" to --the sidewalls-- |
| Claim 22, | Column 18, | Line 8,  | change "by sidewalk" to --by sidewalls-- |

Signed and Sealed this
Fourth Day of July, 2023

*Katherine Kelly Vidal*
Katherine Kelly Vidal
*Director of the United States Patent and Trademark Office*